United States Patent [19]

Hirata et al.

[11] Patent Number: 4,487,161

[45] Date of Patent: Dec. 11, 1984

[54] SEMICONDUCTOR DEVICE MANUFACTURING UNIT

[75] Inventors: Yoshihiro Hirata; Kuniaki Miyake; Hisao Yakushiji, all of Hyogo, Japan

[73] Assignee: VLSI Technology Research Association, Kanagawa, Japan

[21] Appl. No.: 201,115

[22] Filed: Oct. 28, 1980

[30] Foreign Application Priority Data

Oct. 30, 1979 [JP] Japan .................. 54-140718

[51] Int. Cl.³ ........................................ C23C 13/08
[52] U.S. Cl. ................................ 118/723; 118/729; 118/725; 118/500; 118/733
[58] Field of Search .............. 118/723, 725, 500, 728, 118/50.1, 729, 733; 427/38, 39, 47, 86, 93; 219/121 P; 204/164; 250/527, 528, 531

[56] References Cited

U.S. PATENT DOCUMENTS

| | | | |
|---|---|---|---|
| 3,297,465 | 1/1967 | Connell et al. | 427/47 X |
| 3,485,666 | 12/1969 | Sterling et al. | 427/39 |
| 3,843,392 | 10/1974 | Sterling et al. | 427/39 X |
| 3,875,068 | 4/1975 | Mitzel | 204/164 X |
| 3,916,034 | 10/1975 | Tsuchimoto | 427/47 X |
| 4,129,090 | 12/1978 | Inaniwa et al. | 118/728 |
| 4,178,877 | 12/1979 | Kudo | 204/164 X |
| 4,223,048 | 9/1980 | Engle, Jr. | 118/723 X |

FOREIGN PATENT DOCUMENTS 2344581  4/1975  Fed. Rep. of Germany ........ 427/47

*Primary Examiner*—John D. Smith
*Assistant Examiner*—Bernard F. Plantz
*Attorney, Agent, or Firm*—Sughrue, Mion, Zinn, Macpeak & Seas

[57] ABSTRACT

A semiconductor device manufacturing unit in which plasma gas is maintained sealed in a quartz tube by a magnet disposed outside the quartz tube to make the density of plasma gas high and uniform thereby improving the quality of CVD films deposited with the gas and reducing the processing time for semiconductor wafers. A wafer holder is movably mounted in the quartz tube. A support bar is provided for moving the wafer holder with the support bar serving additionally as a ground electrode. An RF electrode and magnet are disposed outside the quartz tube. A heater may be disposed outside the RF electrode and magnet.

5 Claims, 2 Drawing Figures

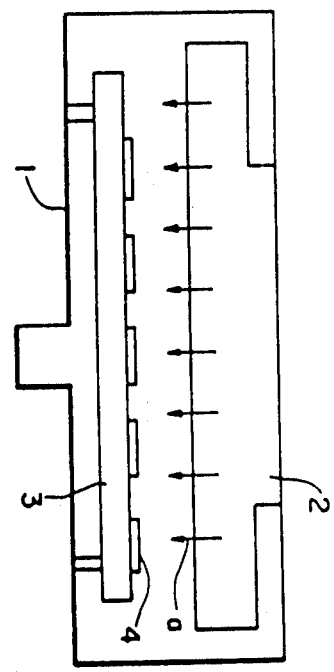
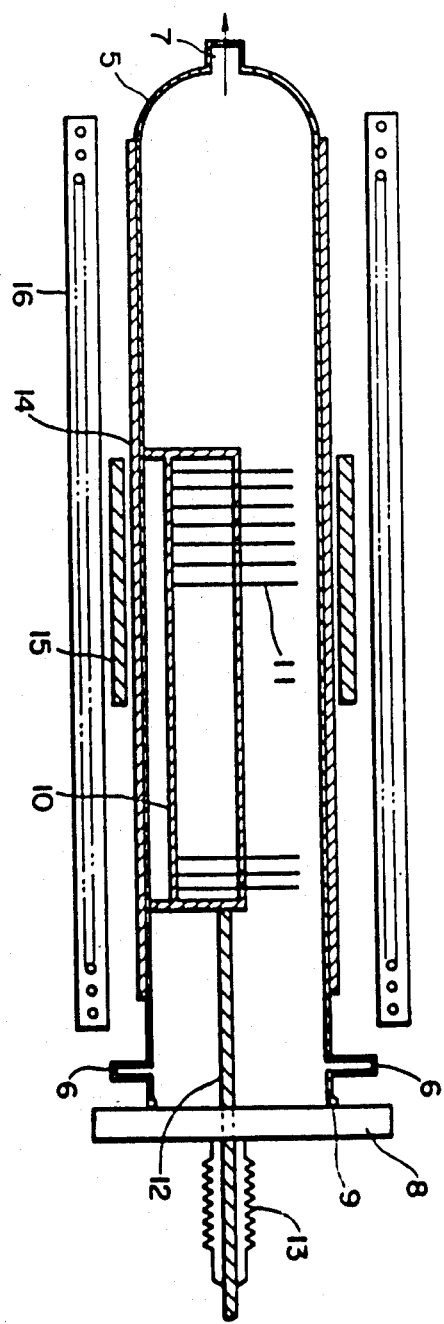

SEMICONDUCTOR DEVICE MANUFACTURING UNIT

BACKGROUND OF THE INVENTION

The present invention relates to a semiconductor device manufacturing unit which is used to form plasma CVD films on semiconductor wafers.

In manufacturing semiconductor devices such as integrated circuits, vacuum evaporation, sputtering, plasma CVD (chemical vapor deposition), or electrolytic oxidation is usually employed for formation of films. Among these methods, the plasma CVD method is of particular interest because with it films can be achieved at low temperatures and the quality of the films thus deposited is most suitable for dry processes.

FIG. 1 shows a conventional parallel flat plate type semiconductor device manufacturing unit which implements the plasma CVD method. In FIG. 1, reference numeral 1 designates a chamber, 2 an RF (high frequency) electrode provided in the chamber 1, and 3 a susceptor. The electrode 2 generates a plasma gas a by which CVD films are formed on semiconductor wafers 4 on the susceptor 3.

The conventional unit is disadvantageous in the following points. As the flow of plasma gas a is not uniform, the formed CVD films are not uniform. In addition the number of semiconductor wafers processable in one batch is small. As the density of the plasma gas a is low, the speed of deposition of the CVD film is low and accordingly the time required for processing each batch of semiconductor wafers is long. Furthermore, it is difficult to control the temperature in the chamber 1 and hence the quality of the CVD films is unstable. As the temperature distribution is not uniform, flakes are liable to be formed on the electrode. Also, it requires much time to clean the electrode of the flakes. Moreover, as the flakes fall on the main surfaces of the wafers, it is difficult to obtain stable films which are of excellent quality.

SUMMARY OF THE INVENTION

Accordingly, an object of the invention is to provide a semiconductor device manufacturing unit in which the plasma gas is maintained sealed in a quartz tube with a magnet disposed outside the quartz tube to make the density of the plasma gas high and uniform thereby improving the quality of the CVD films formed by the gas and reducing the time required for processing semiconductor wafers. A wafer holder is moved through the magnet to effectively achieve the deposition of the CVD films.

More specifically, a semiconductor device manufacturing unit of the invention includes a quartz tube and a wafer holder which is movably mounted in the quartz tube. A support bar is provided for moving the wafer holder with the support bar additionally serving as a ground electrode. An RF electrode and a magnet are disposed outside the quartz tube. The wafer holder preferably is constructed so as to arrange the semiconductor wafers longitudinally in the wafer holder with respect to the quartz tube.

BRIEF DESCRIPTION OF THE DRAWINGS

FIG. 1 is a sectional view of a conventional semiconductor device manufacturing unit; and FIG. 2 is a sectional view of a semiconductor device manufacturing unit according to the invention.

DESCRIPTION OF THE PREFERRED EMBODIMENTS

A preferred embodiment of the invention will be described with reference to FIG. 2 which shows a diffusion furnace type semiconductor device manufacturing unit constructed according to the invention. The unit, as shown in FIG. 2, includes a quartz tube 5, inlets 6 for introducing the gas which is used to produce the plasma gas, an outlet 7 for discharging the gas, a flange 8, a shielding O-ring 9, a semi-cylindrical wafer holder 10 for holding semiconductor wafers 11 which is made of graphite or aluminum and is movable longitudinally in the quartz tube 5, and a metal support bar 12 coupled directly to the wafer holder 10. The wafer holder 10 is moved by operating the support bar 12. The support bar 12 is grounded and accordingly the wafer holder 10 is grounded. The unit further includes a flexible bellows 13 adapted to isolate the interior of the quartz tube 5 from the external atmosphere while the support bar 12 can be moved longitudinally, a cylindrical RF (high frequency) electrode 14 in close contact with the outer wall of the quartz tube 5, a permanent magnet or electromagnet 15 which is ring-shaped and surrounds the quartz tube 5, and a heater 16 including a heat insulating material. In FIG. 2, the magnet 15 is shown as being outside the RF electrode 14 although the magnet 15 may be provided inside the electrode 14 if desired.

In the unit thus constructed, the magnet 15 is disposed outside the quartz tube 5. Accordingly, even under a low pressure, for instance $1 \times 10^{-2}$ Torr, the plasma gas is maintained sealed in the quartz tube 5 for a long period of time and the gas density is increased. Accordingly, the speed of formation of a CVD film on the semiconductor wafers is increased, that is, the processing time per batch is reduced. As the semiconductor wafers are moved through the field of the magnet 15, the plasma gas is uniformly distributed over the semiconductor wafers as a result of which the CVD films thus formed are substantially uniform in thickness. Furthermore, the temperature in the quartz tube 5 can be readily controlled and accordingly the films have a quite stable quality and the temperature distribution in the quartz tube is uniform with the result that few if any flakes are formed on the electrode.

As shown in FIG. 2, the semiconductor wafers are arranged longitudinally in the wafer holder 10. Therefore, the distance of movement of the wafer holder is short and accordingly the unit can be made small in size. In addition, the unit is advantageous in that flakes formed on the electrode cannot fall on the wafers.

As is clear from the above description, with the semiconductor device manufacturing unit according to the invention, the quality of the CVD film is improved with respect to that of prior art units and the processing time is reduced.

What is claimed is:

1. A semiconductor device manufacturing unit comprising:

a quartz tube adapted to be sealed;

a wafer holder movably mounted in said quartz tube a support bar for moving said wafer holder in said tube when sealed, said support bar serving as ground electrode; and an RF electrode and a magnet both of which ar disposed outside said quartz tube.

2. The unit as claimed in claim 1 in which said wafer holder comprises means for arranging semiconductor wafers longitudinally in said wafer holder.

3. The unit as claimed in claim 1 wherein said RF electrode is in close contact with the outer wall of said quartz tube and said magnet is disposed outside said RF electrode.

4. The unit as claimed in claim 3 further comprising heater means disposed outside said RF electrode and said magnet.

5. The unit as claimed in any of claims 1-4 further comprising mounting means for said support bar, said mounting means comprising a flange secured to an end of said quartz tube with a sealing O-ring and a sealing bellows operatively coupled between said flange and said support bar.

* * * * *